United States Patent [19]

Raudabaugh

[11] Patent Number: 4,656,555
[45] Date of Patent: Apr. 7, 1987

[54] FILAMENT WRAPPED ELECTRICAL ASSEMBLIES AND METHOD OF MAKING SAME

[75] Inventor: Donald E. Raudabaugh, Wadsworth, Ohio

[73] Assignee: Harvey Hubbell Incorporated, Orange, Conn.

[21] Appl. No.: 681,800

[22] Filed: Dec. 14, 1984

[51] Int. Cl.⁴ .............................................. H02H 1/04
[52] U.S. Cl. ..................................... 361/117; 361/127; 361/420; 361/119; 338/21; 338/113; 174/178
[58] Field of Search ............... 361/127, 126, 117, 128, 361/130, 119, 120, 331, 420; 174/178; 338/21, 71, 93, 99, 113

[56] References Cited

U.S. PATENT DOCUMENTS

| | | | |
|---|---|---|---|
| T102,103 | 8/1982 | Lenk | 361/118 |
| 2,587,587 | 3/1952 | Bellezza et al. | 174/140 |
| 2,947,903 | 8/1960 | Westrom | 361/126 X |
| 2,997,529 | 8/1961 | Fink | 174/138 |
| 3,018,406 | 1/1962 | Innis | 361/128 |
| 3,261,910 | 7/1966 | Jacquier | 174/178 |
| 3,412,273 | 11/1968 | Kennon et al. | 361/127 |
| 3,566,183 | 2/1971 | Olsen et al. | 315/36 |
| 3,567,541 | 3/1971 | Kaczerginski | 156/172 |
| 3,586,934 | 6/1971 | Nakata | 361/329 X |
| 3,706,009 | 12/1972 | Deitz | 361/127 |
| 3,725,745 | 4/1973 | Zisa | 317/104 |
| 3,850,722 | 11/1974 | Kreft | 156/172 |
| 3,973,172 | 8/1976 | Yost | 317/61 |
| 3,987,343 | 10/1976 | Cunningham et al. | 317/61.5 |
| 4,029,380 | 6/1977 | Yonkers | 339/60 R |
| 4,092,694 | 5/1978 | Stetson | 361/126 |
| 4,100,588 | 7/1978 | Kresge | 361/127 |
| 4,107,567 | 8/1978 | Cunningham et al. | 313/325 |
| 4,161,012 | 7/1979 | Cunningham | 361/128 |
| 4,218,721 | 8/1980 | Stetson | 361/117 |
| 4,404,614 | 9/1983 | Koch et al. | 361/126 X |
| 4,467,387 | 8/1984 | Bergh et al. | 361/132 |
| 4,491,687 | 11/1985 | Kaczerginski et al. | 174/178 |

FOREIGN PATENT DOCUMENTS

| | | |
|---|---|---|
| 730710 | 5/1955 | United Kingdom . |
| 1109151 | 4/1968 | United Kingdom . |
| 1505875 | 3/1978 | United Kingdom . |

Primary Examiner—Philip H. Leung
Assistant Examiner—Todd E. DeBoer
Attorney, Agent, or Firm—Jerry M. Presson; Alfred N. Goodman; Darle M. Short

[57] ABSTRACT

An electrical assembly comprising a plurality of electrical components aligned in a row under an axial load and wrapped with filament windings. The wrapped components are then preferably enclosed in a housing. MOV blocks can be used as the electrical components, resulting in a surge arrester having excellent heat transfer properties as well as improved tensile and cantilever strengths. The electrical components can be varistors, resistors, capacitors and insulators or any combination thereof.

39 Claims, 4 Drawing Figures

FILAMENT WRAPPED ELECTRICAL ASSEMBLIES AND METHOD OF MAKING SAME

FIELD OF THE INVENTION

This invention relates to electrical assemblies and a method for making the assemblies. More specifically, it relates to electrical assemblies which are tightly coupled by means of nonconductive filament winding. Even more specifically, this invention relates to surge arresters comprised of metal oxide varistor blocks (MOV blocks) which are wrapped under an axial load with a filament winding. Preferably, the wrapped blocks are then at least partially enclosed in a polymeric weathershed housing, although other weather-tight enclosures, such as porcelain housings or transformer tanks are contemplated.

BACKGROUND OF THE INVENTION

A surge protector or arrester is commonly connected across a comparatively expensive piece of electrical equipment to shunt over-current surges. Such over-current surges occur, for example, when lightning strikes. When this happens, the surge arrester shunts the surge to ground, thereby protecting the piece of electrical equipment and the circuit from damage or destruction.

Present day surge arresters commonly include an elongated, hollow cylindrical housing made of porcelain or the like, and a plurality of non-linear resistive blocks within the housing. Some of these structures also include spark gaps, the blocks and gaps being electrically interconnected to handle voltage and current surge conditions arising on a power line. The blocks commonly contain silicone carbide (SIC) or metal oxide varistors (MOV), and are usually in the shape of relatively short cylinders stacked within the arrester housing. The number of blocks employed is a function of the material (SIC or MOV) and the voltage and current ratings of the assembly.

For a surge arrester to function properly, intimate contact must be maintained between the MOV or SIC blocks. This necessitates placing an axial load on the blocks within the housing. Prior art arresters utilize bulky contact springs within the housing to provide this axial load. Typically, these springs can provide only relatively small loads, for example, about sixty pounds. As a result, prior art surge arresters experience one or more problems such as poor heat transfer between the MOV or SIC blocks and arrester terminals; non-uniform current distribution; and high contact resistances at joints. Furthermore, units having low contact force sputter and the ionized metal which is produced can cause axial flashover at high currents.

An additional problem with surge arresters of the prior art is that they, on rare occasions, fail in a dangerous fashion. When these arresters fail and experience high fault currents, the bursting unit may throw parts and cause property damage.

Examples of prior art surge arresters are disclosed in the following U.S. Pat. Nos. 2,587,587 to Bellezza et al.; 3,412,273 to Kennon et al.; 3,524,107 to Reitz; 3,566,183 to Olsen; 3,706,009 to Reitz; 3,973,172 to Yost; 3,987,343 to Cunningham et al.; 4,092,694 to Stetson; 4,100,588 to Kresge; 4,218,721 to Stetson; 4,404,614 to Koch et al.; 4,467,387 to Bergh et al.; and U.S. Defensive Publicaton No. T102,103, as well as U.K. Pat. No. 730,710.

SUMMARY OF THE INVENTION

Accordingly, it is an object of this invention to provide electrical assemblies, such as surge arresters, having high axial loadings, thereby resulting in uniform current distribution, low contact resistance at joints, and excellent heat transfer to the arrester terminals.

Another object of this invention is to provide an electrical assembly, such as a surge arrester, having a shatter-proof housing which has a high-impact strength and which does not fail in a dangerous fashion.

Another object of this invention is to provide a MOV block assembly with greatly improved tensile and cantilever strengths.

Yet another object of this invention is to provide a surge arrester which is forgiving of dimensional variations in associated parts, thereby reducing the need for expensive close tolerances.

The foregoing objects are basically attained by an electrical assembly comprising a plurality of electrical components aligned in a row which are placed under a high axial load, and then tightly coupled by means of a filament winding. The filament wound parts may be at least partially enclosed in a weathershed housing.

Other objects, advantages and salient features of the invention will become apparent from the following detailed description, which, taken in conjunction with the annexed drawings, discloses preferred embodiments of the invention.

DRAWINGS

Referring to the drawings which form a part of this original disclosure:

DETAILED DESCRIPTION OF THE INVENTION

Figure 1:
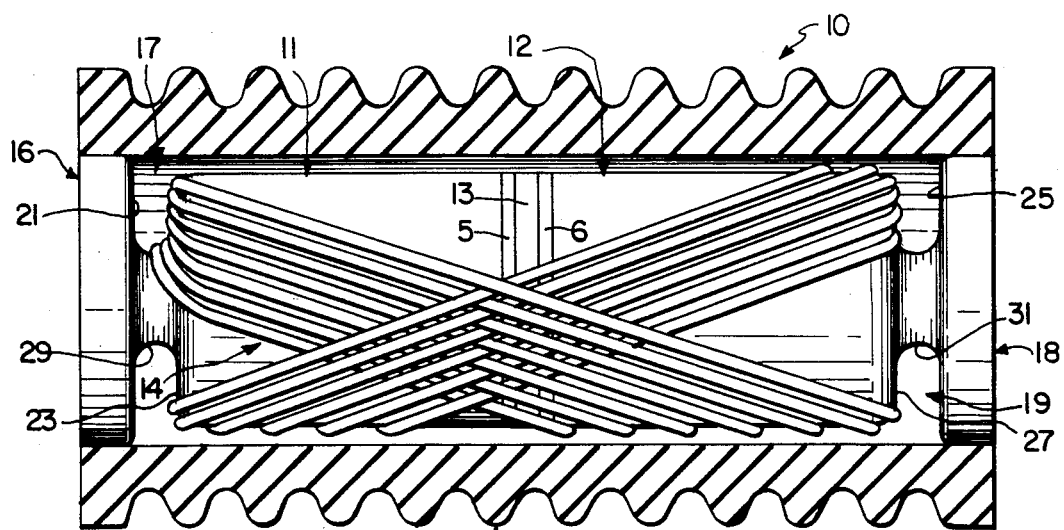
FIG. 1 is a side elevational view, in longitudinal section, showing a surge arrester constructed in accordance with the principles of this invention.
Figure 2:
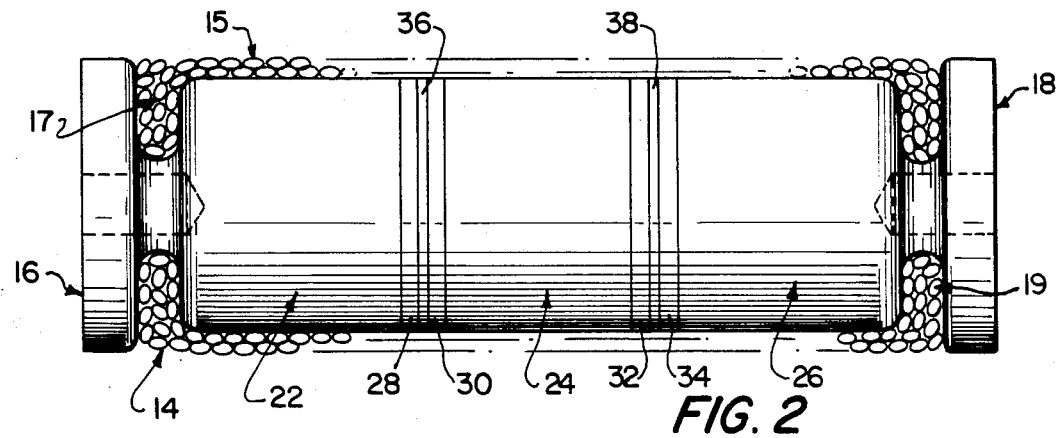
FIG. 2 is a side elevational view, in section, of a modified filament wrapped subassembly comprising a plurality of MOV blocks, spring washers, and spacers which are filament wrapped in several layers in accordance with the principles of this invention.
Figure 3:
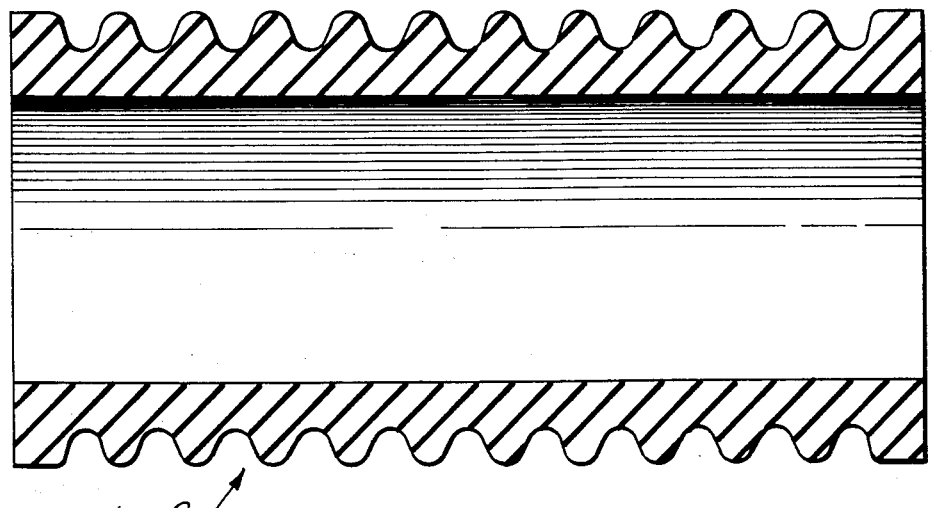
FIG. 3 is a side elevational view of a pre-cured polymeric weathershed housing which is designed to receive the filament wrapped MOV blocks.

As seen in FIGS. 1, 2, and 3, the invention may take the form of a surge arrester 10 comprising a filament wound core of MOV blocks 11 and 12, first and second terminal pieces 16 and 18, filament windings 14, and a polymeric weathershed housing 20. The blocks 11 and 12 are separated by a spring washer 13, and load and current distributing washers 5 and 6.

As seen in FIG. 2, a modified filament wound subassembly 15 may comprise three MOV blocks 22, 24 and 26, conducting spacers 28, 30, 32 and 34, spring washers 36 and 38, filament windings 14, and first and second terminal pieces 16 and 18, having first and second circumferential grooves 17 and 19. Windings 14 provide a plurality of layers over the MOV blocks.

FIG. 3 shows the pre-cured polymeric weathershed housing 20, which is designed to receive the filament wrapped subassembly 15 shown in FIG. 2 as well as that shown in FIG. 1.

The MOV blocks furnish a predetermined non-linear electrical characteristic between the ends thereof in a well known fashion. The blocks themselves are usually in the shape of relatively short cylinders and may be stacked within the housing in a row either in intimate contact with each other, or separated by one or more spring washers 36 and 38 and/or spacers 38, 30 and 32 as illustrated in FIG. 2. The preferred construction, which is shown in FIG. 1, comprises placing a spring washer 13 and load and current distributing washers 5 and 6 between the two MOV blocks 11 and 12, which are adjacent to, and in intimate contact with the terminal pieces 16 and 18. This provides an excellent thermal path to ambient and improves operating characteristics when thermal stability is a factor.

The filament windings 14 may be comprised of any suitable continuous fiber such as nylon, rayon, glass and polyethylene. Other fibers such as ceramic fibers may also be used. A glass filament winding is preferred.

Figure 4:
FIG. 4 is an enlarged transverse cross-sectional view of a filament winding which may be used in accordance with this invention and comprises a plurality of strands.

The filament windings 14 may be in the form of a single fiber, or each winding may be comprised of many smaller strands 15 as depicted in FIG. 4.

The filament windings may optionally carry a resinous material. The resin may be either natural or synthetic, and may be in the partially cured or uncured state. While epoxy resins are preferred, and other suitable resin may be used.

The polymeric weathershed housing 20 may be of any shape and size which will achieve the desired effects of providing a shatterproof enclosure having high impact strength and good weather resistance. The weathershed housing may be comprised of a rigid or elastomeric polymer, and may be either synthetic, natural, or a combination thereof. Examples of such polymers are natural and synthetic rubbers, synthetic thermoplastic elastomers, such as nylon, polyvinylchloride, and polyethylene (linear), and thermosetting elastomers such as polyethylene (cross-linked), and polyesters. The preferred weathershed elastomer is ethylene-propylene rubber (EPM).

The terminal pieces 6 and 18 may be comprised of any conductive material, preferably a highly conductive metal, and should preferably contain circumferential annular grooves to aid in the process of winding the filament.

In FIGS. 1 and 2, the circumferential grooves or recesses 17 and 19 are shown as having vertical sidewalls 21, 23, 25 and 27, i.e., sidewalls whose surfaces are perpendicular to the longitudinal central axis of the aligned component and form shoulders that radially extend. These sidewalls are joined by annular curved bottom walls 29 and 31. In practice, these grooves may be of any configuration which will serve the purpose of retaining the windings or they may be merely substantially radially extending shoulders.

The spring washers and spacers themselves are conventional and need not be described in detail.

While the discussion has centered on the use of MOV blocks, it should be understood that the invention contemplates and FIGS. 1 and 2 also depict the use of other electrical components such as resistors, capacitors, and insulators in place of, or in addition to, MOV blocks. Such arrangements will be useful for other types of electrical assemblies.

It should also be noted that while the drawings illustrate components having a right circular cylindrical configuration, "cylindrical", as defined for the purposes of this invention is broadly defined as the surface traced by a straight line moving parallel to a fixed straight line and intersecting a fixed curve. A curve is the intersection of two geometrical surfaces. Also, the term "axial", for the purposes of this invention, refers to the longitudinal central axis of the structure. Thus, while cylindrical blocks are preferred, blocks having a polygonal cross section may be used.

The method for making the surge arrester of this invention comprises a first step of aligning a plurality of MOV blocks, with or without interposed spacers and/or spring washers, under an axial load. This invention contemplates the use of any axial load from about 20 pounds per square inch of block cross section up to just less than the crushing strength of the blocks employed. The preferred range is from about 50 pounds per square inch to 500 pounds per square inch of block cross section.

Any known manner for placing the aligned MOV blocks under an axial load would be acceptable provided it facilitates the wrapping process. One acceptable method is to align the blocks in a lathe-type apparatus capable of providing an axial load.

Once the plurality of MOV blocks, with or without spacers and spring washers, is aligned and placed under an axial load, it is ready to be filament wrapped. Any suitable method for filament wrapping the aligned components is acceptable provided that it will retain the aligned components under the specified axial load. The preferred method for wrapping the aligned components comprises a helical and overlapping wrapping at a relatively low helical angle and is as follows. First, the filament winding is secured over the shoulder of one terminal piece. Then the components are rotated approximately 180°, while the filament is drawn axially along the surface of the assembled components. Upon reaching the opposite terminal piece, the filament is wound over the other shoulder for approximately another 180°. The winding machine then sends the filament back to the starting material while the components rotate another 180°. Again, the filament makes a half turn in the terminal groove and this cycle is repeated as many times as is desired. The degree of rotation and the axial traverse are slightly out of synchronism so that subsequent cycles will advance the windings around the surface of the components. Multiple cycles will ultimately cover the entire surface with the filament. A partially covered subassembly using this winding pattern is illustrated in FIG. 1. Additional layers of winding may be added for additional strength as shown in FIG. 2.

In practice, if the degree of rotation and the axial traverse are approximately seven degrees out of synchronism, twenty-five cycles will approximately cover the entire surface, and 100 cycles will provide four layers of winding for additional strength.

It should be understood that this process does not require axial rotations of 180°. Rather, any axial rotation is acceptable provided that a wrap results which will retain the components under an axial load. In other words, upon reaching a terminal end, the filament could be wrapped around the shoulder for more or less than 180°. Also, the filament may be drawn axially along the aligned components with lesser or greater rotational movement between the components and the filament.

Also, if a notched shoulder is used, no relative rotation need be used thereby allowing for pure axial lay of the filament without slippage at the shoulder.

As previously mentioned, the filament winding may carry a resinous compound. The resinous compound may be applied to the filament winding by any number of means such as pre-coating the filament in a resinous bath, or applying the resinous compound to the filaments after the components have been wrapped. Additionally, the resinous compound may be either in the semi-cured or uncured state. If the resinous compound is in the uncured state, curing will take place at a later time, preferably during application of the polymeric weathershed housing.

Once the components have been wrapped, the weathershed housing may be applied. As previously mentioned, the housing preferably comprises a polymeric compound. This application can be done in numerous ways, such as by inserting the filament wrapped subassembly into a pre-cured elastomeric polymer weathershed. If the filament winding carries an uncured resinous compound, the windings may be adhesively bonded to the pre-cured weathershed in an oven to create a finished arrester. Other methods such as molding, spraying, or dipping may be used to provide a polymeric weathershed onto the filament wound components. Virtually any method which achieves the desired result is acceptable.

When a precured elastomeric weathershed is used, the housing is straight walled inside as shown in FIG. 3. This facilitates assembly. In practice, the outer end diameter of the terminal pieces is made equal to the diameter of the wound subassembly. The diameter of the shoulder is less by the thickness of glass over the shoulder. After the body of the subassembly is wound, any remaining groove is filled with resin-wetted glass wound circumferentially at both ends. The finished subassembly should, to the extent possible, approximate a smooth cylinder as shown in FIG. 2.

Again, while the invention has been illustrated in terms of a surge arrester, the process for providing filament windings can be applied to any suitable electrical assembly comprising elements such as resistors, capacitors, and insulators instead of, or in addition to, MOV parts.

If other components are added to or substituted in the assembly, a similarly shaped electrical assembly should result. The length to radius ratio may be different than that normally associated with surge arresters, however, the concept of providing a filament wrapped electrical assembly will remain.

While various embodiments have been chosen to illustrate the invention, it will be understood by those skilled in the art that various changes and modifications can be made therein without departing from the scope of the invention as defined in the appended claims.

What is claimed is:

1. An electrical assembly, the combination comprising:
   a plurality of conductive electrical components aligned in a row and having axially-directed ends, said electrical components being in electrical connection with one another via said axially-directed ends; and
   means, wrapped around said components, for applying an axially-directed compressive force on said plurality of electrical components to maintain said electrical connection thereof,
   said means including a non-conductive filament winding.

2. An electrical assembly as defined in claim 1, wherein said electrical components comprise MOV blocks.

3. An electrical assembly as defined in claim 1, and further comprising
   a weathershed housing, said housing at least partially enclosing said means and said electrical components.

4. An electrical assembly as defined in claim 3, wherein said weathershed housing is formed of polymeric material.

5. An electrical assembly as defined in claim 1, wherein said filament winding carries a resinous compound.

6. An electrical assembly as defined in claim 1, wherein said electrical components comprise at least one resistor.

7. An electrical assembly as defined in claim 1, wherein said electrical components comprise at least one capacitor.

8. An electrical assembly as defined in claim 1, and further including
   biasing means, interposed between two of said plurality of electrical components, for biasing said two of said plurality of electrical components away from one another in the axial direction.

9. An electrical assembly as defined in claim 1, wherein said electrical components define a pair of spaced shoulders at opposite ends of the row formed thereby which receive portions of said filament winding thereon.

10. A surge arrester comprising:
    a plurality of MOV pairs aligned in a row and under an axial compressive load and having axially-directed ends, said MOV parts being in electrical connection with one another via said axially-directed ends; and
    means, wrapped around said MOV parts, for tightly coupling said MOV parts together and maintaining such axial compressive load to maintain said electrical connection thereof,
    said means including a non-conductive filament winding.

11. A surge arrester as defined in claim 10, and further comprising at least one spring washer located between adjacent MOV parts.

12. A surge arrester as defined in claim 10, wherein said filament winding carries a resinous compound.

13. A surge arrester as defined in claim 10, wherein said MOV parts define a pair of spaced shoulders at opposite ends of the row formed thereby which receive portions of said filament winding thereon.

14. A surge arrester as defined in claim 10, and further comprising
    biasing means, interposed between two of said MOV parts, for biasing said two of said MOV parts away from one another in the axial direction.

15. A surge arrester as defined in claim 10, and further comprising
    a weathershed housing, said housing at least partially enclosing said means and said MOV parts.

16. A surge arrester as defined in claim 15, wherein said weathershed housing is formed of polymeric material.

17. A method of making an electrical assembly comprising the steps of
    aligning a plurality of conductive electrical components in a row, placing the row of electrical components in electrical connection via axial compression, and wrapping the plurality of aligned electrical components with a non-conductive filament winding to maintain the axial compression and to maintain the electrical connection thereof.

18. A method as defined in claim 17, and further comprising the step of providing the filament winding with a resinous coating.

19. A method as defined in claim 17, and further comprising the step of at least partially enclosing the filament wrapped electrical components in a weathershed housing.

20. A method as defined in claim 17, wherein the placing step further comprises the step of biasing two of the plurality of conductive electrical components away from one another in the axial direction.

21. The method as defined in claim 17, wherein the step of aligning further comprises aligning the electrical components between a first terminal electrical component having a first shoulder and a second terminal electrical component having a second shoulder, and the step of wrapping comprises establishing at least one turn of filament winding on the surface of the components, wherein each turn has at least one portion in the first shoulder, at least one portion on the surface of the components, and at least one portion in the second shoulder.

22. The method as described in claim 21, wherein the step of establishing comprises (A) securing the filament winding in the first shoulder of the first terminal component, (B) traversing the filament axially along the surface of the aligned electrical components, (C) upon reaching the second terminal piece, winding the filament in the second shoulder by causing at least a partial relative axial rotational movement between the filament and the components, (D) traversing the filament back along the surface of the aligned electrical components, (E) winding the filament in the first shoulder by causing at least a partial relative axial rotational movement between the filament and the components, and (F) repeating steps B through E for a plurality of cycles, altering the rotation of the components and the axial traverse slightly out of synchronism so that subsequent cycles advance the filament winding around the surface of the components.

23. The method as described in claim 22 wherein at least one of the steps B and D further comprises causing relative axial rotational movement between the filament winding and aligned components while traversing the filament winding along the surface of the components.

24. A method as defined in claim 17, wherein the wrapping step is continued to provide a plurality of layers of filament winding.

25. A method of making a surge arrester comprising the steps of aligning a plurality of MOV parts in a row, placing the MOV parts in electrical connection via an axial load, and wrapping the plurality of aligned MOV parts with a non-conductive filament winding to tightly couple the parts together to maintain the axial load and to maintain the electrical connection thereof.

26. A method as defined in claim 25, and further comprising the step of providing the filament winding with a resinous coating.

27. A method as defined in claim 25, and further comprising the step of at least partially enclosing the filament wrapped electrical components in a weathershed housing.

28. The method as defined in claim 25, wherein the step of aligning MOV parts further comprises aligning at least one spring washer between at least one pair of MOV parts.

29. A method as defined in claim 25, wherein the axial load is from about 50 pounds per square inch to about 500 pounds per square inch of block cross section.

30. A surge arrester comprising:

a plurality of resistive blocks having axially-directed ends and being in electrical connection with one another via said axially-directed ends, and non-conductive filament windings wound around said plurality of blocks, said filament windings applying an axial compressive force on said plurality of resistive blocks to maintain said blocks in electrical connection.

31. A surge arrester according to claim 30, wherein said resistive blocks are in the shape of cylinders and are arranged end-to-end in a row, said row of blocks having a first free end and a second free end, at least a portion of said windings extending between said free ends.

32. A surge arrester according to claim 30, further comprising a weathershed housing, said resistive blocks and windings being located within said housing.

33. A surge arrester according to claim 31, further comprising a conductive spacer and a spring means between said resistive blocks.

34. A surge arrester according to claim 33, wherein said conductive spacer distributes a current throughout the cross-sectional area of the resistive blocks.

35. A surge arrester according to claim 30 further comprising first and second conductive end pieces in abutment with said first and second free ends, respectively.

36. A surge arrester as defined in claim 30, and further comprising biasing means, interposed between two of said resistive blocks, for biasing said two of said resistive blocks away from one another in the axial direction.

37. A method of constructing a surge arrester comprising the step of providing a plurality of resistive blocks, placing the blocks in a row, placing the blocks in axial compression and thereby electrically connecting the blocks, and wrapping windings of non-conductive filament around the blocks to maintain the blocks in axial compression and to maintain the electrical connection thereof.

38. A method according to claim 37 and further comprising the steps of coating at least a portion of the filament with a resinous composition; and curing the composition while maintaining the compressive force on the plurality of resistive blocks.

39. A method of as defined in claim 37, wherein the second placing step further comprises biasing two of the plurality of resistive blocks away from one another in the axial direction.

* * * * *